United States Patent
Hirokawa et al.

(10) Patent No.: US 6,703,678 B2
(45) Date of Patent: Mar. 9, 2004

(54) SCHOTTKY BARRIER FIELD EFFECT TRANSISTOR LARGE IN WITHSTANDING VOLTAGE AND SMALL IN DISTORTION AND RETURN-LOSS

(75) Inventors: Tomoaki Hirokawa, Tokyo (JP); Zenzou Shingu, Tokyo (JP); Shigeru Saitou, Tokyo (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 09/966,934

(22) Filed: Sep. 28, 2001

(65) Prior Publication Data

US 2002/0043697 A1 Apr. 18, 2002

(30) Foreign Application Priority Data

Oct. 6, 2000 (JP) .................................. 2000-307335

(51) Int. Cl.⁷ ............................................. H01L 27/095
(52) U.S. Cl. .................. 257/472; 257/280; 257/401; 257/471; 257/473; 257/476
(58) Field of Search ................. 257/472, 471, 257/473, 476, 280, 401

(56) References Cited

U.S. PATENT DOCUMENTS

| | | | |
|---|---|---|---|
| 4,551,905 A | * 11/1985 | Chao et al. ............. | 29/571 |
| 4,774,206 A | * 9/1988 | Willer ................. | 437/175 |
| 5,001,076 A | * 3/1991 | Mikkelson ............. | 437/40 |
| 5,331,185 A | * 7/1994 | Kuwata ............... | 257/192 |
| 5,382,821 A | * 1/1995 | Nakajima ............. | 257/401 |
| 5,389,807 A | * 2/1995 | Shiga ................. | 257/280 |
| 5,643,811 A | * 7/1997 | Hasegawa ............. | 437/40 |
| 5,923,072 A | * 7/1999 | Wada et al. ........... | 257/473 |
| 5,942,447 A | * 8/1999 | Miyakumi ............. | 438/740 |
| 5,994,725 A | * 11/1999 | Ohnishi et al. ......... | 257/197 |
| 6,469,326 B2 | * 10/2002 | Higuchi et al. ......... | 257/192 |
| 2003/0132463 A1 | * 7/2003 | Miyoshi .............. | 257/280 |

FOREIGN PATENT DOCUMENTS

| | | | |
|---|---|---|---|
| EP | 613 190 | * 8/1994 | |
| JP | 63-87773 | 4/1988 | .......... H01L/29/80 |
| JP | 63-305566 | * 12/1988 | |
| JP | 2000 3919 | * 1/2000 | |
| JP | 2000-21902 | * 1/2000 | |
| JP | 2000-100831 | 4/2000 | .......... H01L/29/80 |

* cited by examiner

Primary Examiner—Nathan J. Flynn
Assistant Examiner—Ahmed N. Sefer
(74) Attorney, Agent, or Firm—Hayes Soloway P.C.

(57) ABSTRACT

A Schottky barrier field effect transistor has a gate electrode formed with a field plate in order to achieve a high withstanding voltage, where the thickness of the dielectric layer between the channel layer and the field plate, the distance between the Schottky contact and the drain and the length of the field plate falls within the range of 300 nanometers to 600 nanometers thick, the range from 800 nanometers to 3000 nanometers long and the range of the distance between the Schottky contact and the drain is plus or minus 400 nanometers, respectively, so that the distortion and the return-loss are improved without sacrifice of the withstanding voltage.

13 Claims, 6 Drawing Sheets

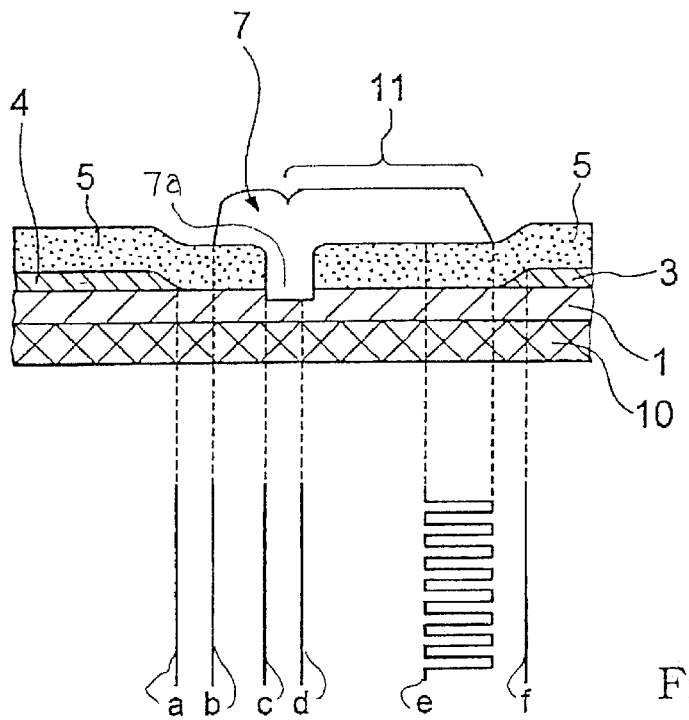
Fig. 7A
Fig. 7B
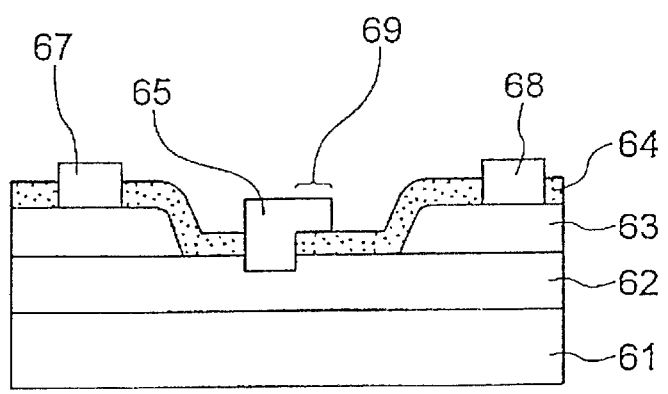
Fig. 1
PRIOR ART

SCHOTTKY BARRIER FIELD EFFECT TRANSISTOR LARGE IN WITHSTANDING VOLTAGE AND SMALL IN DISTORTION AND RETURN-LOSS

FIELD OF THE INVENTION

This invention relates to a Schottky barrier field effect transistor and, more particularly, to a high-frequency large-output Schottky barrier field effect transistor.

DESCRIPTION OF THE RELATED ART

Gallium arsenide, i.e., GaAs has a large electron mobility, which is five to six times larger than the electron mobility of silicon. The peak value of the saturated drift velocity in gallium arsenide is twice that of silicon. Another attractive feature is that gallium arsenide acts as a semi-insulating substrate. These features are put to practical use in the field of semiconductor device manufacturing. The conventional field effect transistor is fabricated on a silicon substrate which hardly responds to a microwave band signal. However, the gallium arsenide Schottky barrier field effect transistor is highly responsive to the microwave signal, and is employed in microwave electronic devices. In fact, the gallium arsenide Schottky barrier field effect transistor tends to supersede the electron tubes. The demand for a high-frequency large-output Schottky barrier field effect transistor is getting larger.

A typical example of the gallium arsenide Schottky barrier field effect transistor is one fabricated on a semi-insulating gallium arsenide substrate, and then the semi-insulating gallium arsenide substrate is overlaid by a thin gallium arsenide channel layer. A source electrode and a drain electrode are held in ohmic contact with the thin gallium arsenide channel layer. A gate electrode is formed on the thin gallium arsenide channel layer between the source electrode and the drain electrode. The gate electrode and the thin channel layer form a Schottky barrier. A depletion layer extends from the Schottky barrier into the thin gallium arsenide channel layer.

A problem inherent in the prior art gallium arsenide Schottky barrier field effect transistor is destruction due to a reverse bias voltage applied between the gate electrode and the drain electrode. When the reverse voltage is applied between the gate electrode and the drain electrode, the electric field is concentrated around the edge of the gate electrode on the drain side, and destruction takes place. In order to prevent the gallium arsenide Schottky barrier field effect transistor from destruction, a field plate is formed in the gate electrode, and dielectric layers of silicon dioxide are provided beneath the side portions of the gate electrode as disclosed in Japanese Patent Application laid-open Nos. 63-87773 and 2000-100831.

FIG. 1 shows a cross section of the prior art gallium arsenide Schottky barrier field effect transistor as disclosed in Japanese Patent Application laid-open No. 2000-100831. The prior art Schottky barrier field effect transistor is fabricated on a gallium arsenide semi-insulating substrate 61. The gallium arsenide semi-insulating substrate 61 is overlaid by a channel layer 62. Contact layers 63 are formed on the upper surface of the channel layer 62, and are spaced from each other so that a part of the channel layer 62 is exposed to the recess between the contact layers 63. A source electrode 67 and a drain electrode 68 are respectively formed on the contact layers 63, and are held in ohmic contact. The contact layers 63 and the exposed surface of the channel layer 62 are covered with a dielectric layer 64, and a gate electrode 65 is held in contact with the channel layer 62 through a contact hole formed in the dielectric layer 64. The gate electrode 65 has a field plate 69. The field plate 69 projects from the remaining portion of the gate electrode 65 toward the drain electrode 68, and is separated from the channel layer 62 by the dielectric layer 64.

The prior art teaches that the dielectric layer 64 is improved in withstanding voltage when the following conditional expressions are satisfied.

$$1 < \in < 5 \tag{1}$$

$$25 < t/\in < 70 \tag{2}$$

where $\in$ is dielectric constant of the dielectric layer 64 and t is the thickness of the dielectric layer 64.

The dielectric layer 64 is assumed to be formed of $SiO_2$. The dielectric constant of silicon dioxide is of the order of 3.9. Therefore, the preferable thickness t is calculated from the conditional expressions (1) and (2), and falls within the range of greater than 97.5 nanometers and less than 273 nanometers, i.e., 97.5 nm<t<273 nm.

The prior art Schottky barrier field effect transistor reference teaches that the dielectric layer 64 should be 200 nm thick in order to exhibit good withstanding voltage characteristics. However, the prior art documents are silent to the contour of the field plate.

Using a microwave wide band amplifier, the present inventors measured the return-loss representative of the reduction in the gain of the amplifier. The microwave wide band amplifier formed a part of a communication system, and included two Schottky barrier field effect transistors of different thickness in the dielectric layer. The return loss was measured at 800 MHz. In case where the dielectric layer was 200 nanometers thick, the return-loss was −15 dB. On the other hand, when the dielectric layer was 400 nanometers thick, the return-loss was −18 dB.

The field plate 69, the channel layer 62 and the dielectric layer 64 in combination form a capacitor. The parasitic capacitance is inversely proportional to the thickness of the dielectric layer 64. When the parasitic capacitance is increased, the gain is decreased due to the Miller effect. On the other hand, if the dielectric layer is decreased to a certain thickness greater than 200 nanometers, the suppression of the electric field concentration is weakened, and, accordingly, the withstanding voltage becomes lower. Furthermore, the suppression of the electric field concentration results in strong distortion under the reception of excessively large input power. Namely, when the radio-frequency input signal has an excessively large power, the electric charge is accumulated at the boundary between the channel layer and the dielectric layer on the drain side, and causes the output signal to have large distortion. When the prior art Schottky barrier field effect transistor is incorporated in a wide-amplitude high-power electric circuit, this problem is serious.

SUMMARY OF THE INVENTION

Therefore an important object of the present invention is to provide a Schottky barrier field effect transistor, which is small in return-loss and distortion, and high in withstanding voltage.

In accordance with the above conditions, the present invention, provides a Schottky barrier field effect transistor fabricated on a substrate comprising a channel layer formed of a first compound semiconductor, a source structure connected to a first portion of the channel layer, a drain structure connected to a second portion of the channel layer and spaced from the source structure to form a recess, a dielectric layer covering the channel layer, a part of the source structure and a part of the drain structure and having a contact hole between the source structure and the drain structure and a gate electrode having a Schottky contact portion held in contact with the channel layer through the contact hole and a field plate extending from the Schottky contact portion toward the drain structure on the dielectric, silicon dioxide, layer, and a thickness of the dielectric layer between the channel layer and the field plate equal to or greater than 300 nanometers.

BRIEF DESCRIPTION OF THE DRAWINGS

The features and advantages of the Schottky barrier field effect transistor will be more clearly understood from the following description taken in conjunction with the accompanying drawings in which:

FIG. 1 is a cross sectional view showing the structure of the prior art Schottky barrier field effect transistor;

FIG. 7A is a cross sectional view showing the structure of another Schottky barrier field effect transistor according to the present invention; and FIG. 7B is a plane view showing boundaries among the layers incorporated in the Schottky barrier field effect transistor.

DESCRIPTION OF THE PREFERRED EMBODIMENTS

First Embodiment

Figure 2:
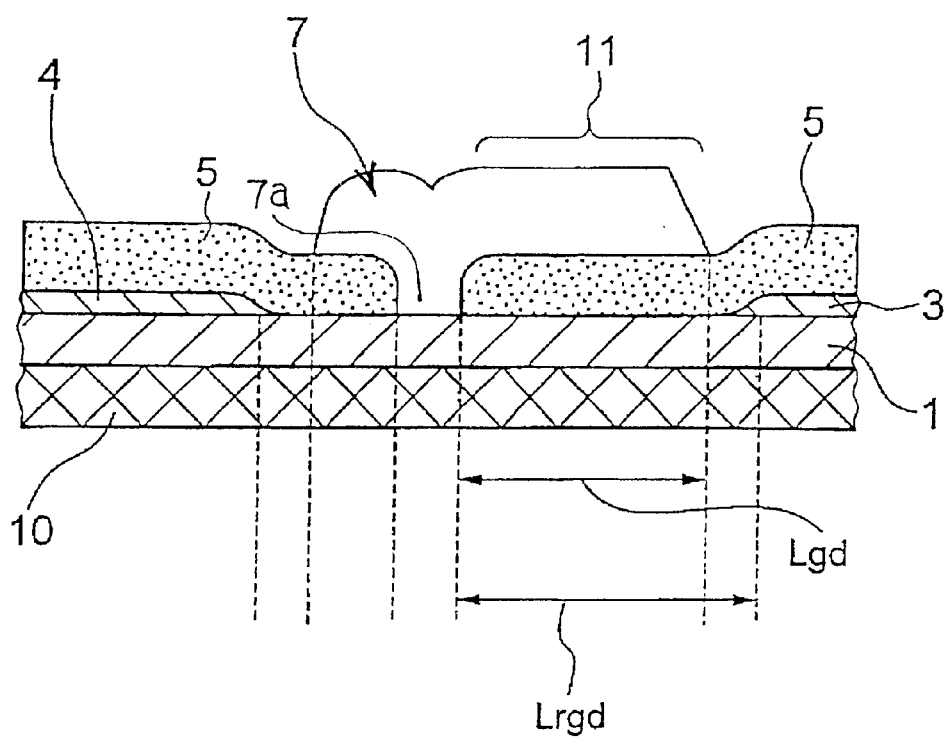
FIG. 2 is a cross sectional view showing the structure of a Schottky barrier field effect transistor according to the present invention.

Referring to FIG. 2 of the drawings, a Schottky barrier field effect transistor embodying the present invention is fabrication on a semi-insulating substrate of gallium arsenide. A channel layer 1 is laminated on the major surface of the semi-insulating substrate, and is formed of n-type gallium arsenide. A drain contact layer 3 and a source contact layer 4 are formed on the channel layer 1, and the drain contact layer 3 is spaced from the source contact layer 4. The drain contact layer 3 and the source contact layer 4 are formed of n-type gallium arsenide. A part of the channel layer 1 is exposed to the gap or recess between the drain contact layer 3 and the source contact layer 4. The drain contact layer 3, the part of the channel layer 1 and the source contact layer 4 are covered with a dielectric layer 5. Though not shown in FIG. 2, a drain electrode and a source electrode are held in contact with the drain contact layer 3 and the source contact layer 4 through contact holes formed in the dielectric layer 5.

A contact hole is formed in the dielectric layer 5, and reaches the part of the channel layer 1 between the drain contact layer 3 and the source contact layer 4. A gate electrode 7 is formed on the dielectric layer 5, and is held in contact with the channel layer 1 through the contact hole. The gate electrode 7 is formed of metal, and Schottky barrier is formed between the channel layer 1 and the gate electrode 7. The gate electrode 7 has a field plate 11, and the field plate 11 projects from the remaining portion of the gate electrode 7 toward the drain contact layer 3. The rest passes through the contact hole, and reaches the channel layer 1. The part of the gate electrode 7 in the contact hole is referred to as "Schottky contact portion," and the Schottky contact portion is labeled as 7a.

The Schottky contact portion 7a is separated from the drain contact layer 3, and reference "Lrgd" of the distance between the contact portion 7a and the drain contact layer 3. Additionally, the distance between the Schottky contact portion 7a and the leading end of the field plate 11 is referred to as "gate/drain overlay distance," and the gate/drain overlay distance is designated by reference "Lgd." In this instance, the distance Lrgd falls within the range of 800 nanometers and 3000 nanometers, and the gate/drain overlay distance Lgd is Lrgd plus or minus 400 nanometers, i.e., Lrgd±400 nanometers.

Figure 3A:
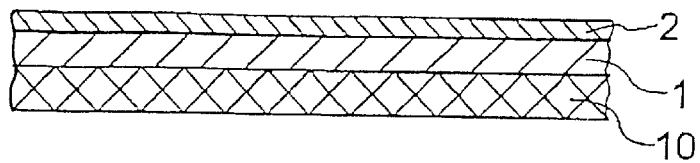
FIGS. 3A to 3E are cross sectional views showing a process sequence for fabricating the Schottky barrier field effect transistor according to the present invention.

A process for fabricating the Schottky barrier field effect transistor will now be described with reference to FIGS. 3A to 3E. First, the semi-insulating substrate 10 of gallium arsenide is prepared. The semi-insulating substrate 10 is placed in the chamber of a molecular beam epitaxial system (not shown). N-type gallium arsenide doped with silicon at $2 \times 10^{17}$ cm$^{-3}$ is epitaxially grown to 25 nanometers thick, and n-type gallium arsenide doped with silicon at $5 \times 10^{17}$ cm$^{-3}$ is grown to 150 nanometers thick. The n-type gallium arsenide doped with silicon at $2 \times 10^{17}$ cm$^{-3}$ forms the channel layer 1, and the n-type gallium arsenide doped with silicon at $5 \times 10^{17}$ cm$^{-3}$ forms an n-type gallium arsenide layer 2 as shown in FIG. 3A.

A photo-resist solution is spun onto the n-type gallium arsenide layer 2, and is baked so as to form a photo-resist layer (not shown). A pattern image for the source and drain contact layers 3, 4 is transferred from a photo mask (not shown) to the photo-resist layer, and a latent image is formed in the photo-resist layer. The pattern image is developed, and the photo-resist layer is patterned into a photo-resist etching mask (not developed, and the photo-resist layer is patterned into a photo-resist etching mask (not shown). Thus, the photo-resist etching mask is formed through photo-lithographic techniques.

Using the photo-resist etching mask, the n-type gallium arsenide layer 2 is selectively removed in gaseous etchant containing chlorine. A recess is formed in the n-type gallium arsenide layer 2, and, accordingly, the n-type gallium arsenide layer 2 is separated into the drain contact layer 3 and the source contact layer 4. The photo-resist etching mask is stripped off.

Figure 3B:
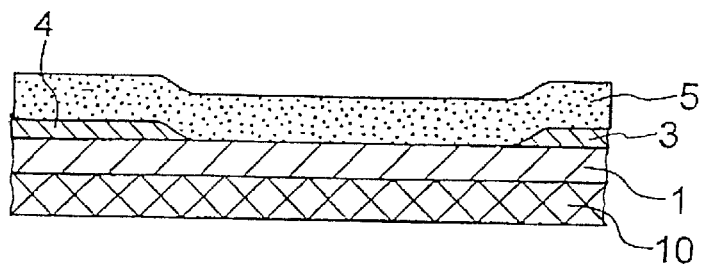

Subsequently, silicon dioxide is deposited to 400 nanometers thick over the entire surface of the resultant structure by using a chemical vapor deposition method, and forms the dielectric layer 5. The resultant structure in this stage is shown in FIG. 3B.

A photo-resist etching mask (not shown) is formed on the dielectric layer 5 by using the photo-lithographic techniques, and has a pattern image for the contact hole. Using the photo-resist etching mask, the dielectric layer 5 is selectively removed with gaseous etchant containing CHF$_3$ or SF$_6$. Thus, the contact hole for the gate electrode 7 is formed in the dielectric layer 5, and a part of the channel layer 1 is exposed to the contact hole. The photo-resist etching mask is stripped off.

Figure 3C:
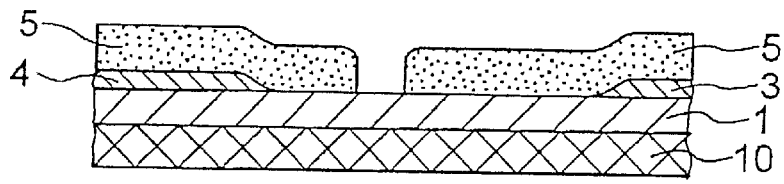

Using the dielectric layer 5 as an etching mask, the channel layer 1 is partially etched, and the channel layer 1 is formed with a shallow recess as shown in FIG. 3C. The shallow recess is of the order of 5 nanometers deep.

Figure 3D:
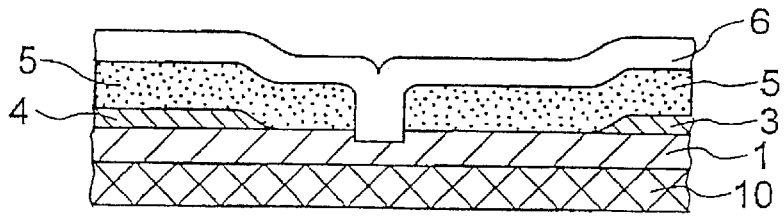

Subsequently, WSi is deposited with a thickness of 200 nm over the entire surface of the resultant structure using a sputtering technique, and Au is further deposited with a thickness of 400 nm over the WSi layer by also using the sputtering technique. The WSi and AU form the metallic layer 6. The metallic layer 6 penetrates into the shallow recess through the contact hole, and is held in contact with the channel layer 1 as shown in FIG. 3D.

Figure 3E:
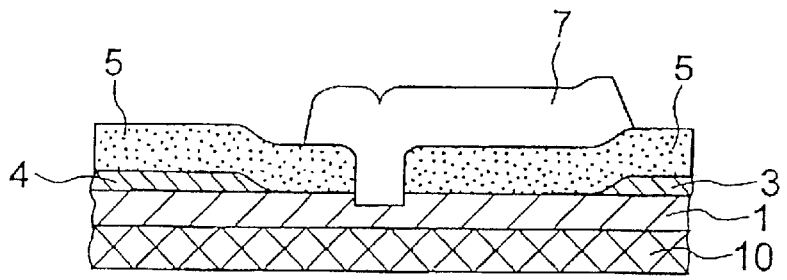

A photo-resist etching mask (not shown) is formed on the metallic layer 6 by using the photo-lithographic techniques, and the metallic layer 6 is patterned into the gate electrode 7 through an ion milling. The gate electrode 7 is on a predetermined area of the dielectric layer 5, and the dielectric layer 5 is exposed on both sides of the gate electrode 7. The photo-resist etching mask is stripped off. The resultant structure is shown in FIG. 3E.

A photo-resist etching mask (not shown) is formed on the dielectric layer 5 by using photo-lithographic techniques, and with a pattern image for the drain/source contact holes. Using the photo-resist etching mask, the dielectric layer 5 is selectively etched so that a drain contact hole (not shown) and a source contact hole (not shown) are formed in the dielectric layer 5. The drain contact layer 3 is exposed to the drain contact hole, and the source contact layer 4 is exposed to the source contact hole. Ni, AuGe and Au are successively deposited to 8 nanometers thick, 50 nanometers thick and 250 nanometers thick using vacuum evaporation, and are formed into a drain electrode and a source electrode (not shown).

The present inventors fabricated samples of the Schottky barrier field effect transistor through the process sequence described, and investigated the characteristics of the Schottky barrier field effect transistor. First, the present inventors prepared two groups of samples. The samples of the first group respectively had the dielectric layers 5 of 200 nanometers thick, and were different in gate/drain overlay distance, Lgd, from one another. On the other hand, the samples of the second group respectively had dielectric layers 5 of 400 nanometers thick, and varied in gate/drain overlay distance, Lgd, from one another. The channel layer 1, the dielectric layer 5 and the gate electrode 7 formed a capacitor. The normalized capacitance was calculated on the n-type gallium arsenide layers on the assumption that the capacitor was a parallel plate. The influence of the resistance ratio and the fringing effect on the capacitance was taken into account. The normalized capacitance was representative of the parasitic capacitance coupled to the Schottky barrier field effect transistor. The relation between the normalized capacitance and the parasitic capacitance is expressed as $$\text{(parasitic capacitance)} = \in_0 \times \in \times \text{(normalized capacitance)} \quad (3)$$

where $\in_0$ was the dielectric constant in vacuum and $\in$ was the dielectric constant of the dielectric layer 5. The dielectric constant in vacuum was $8.854 \times 10^{-6}$, and the dielectric constant of silicon dioxide was 3.9. The units of the parasitic capacitance were in pF.

Figure 4:
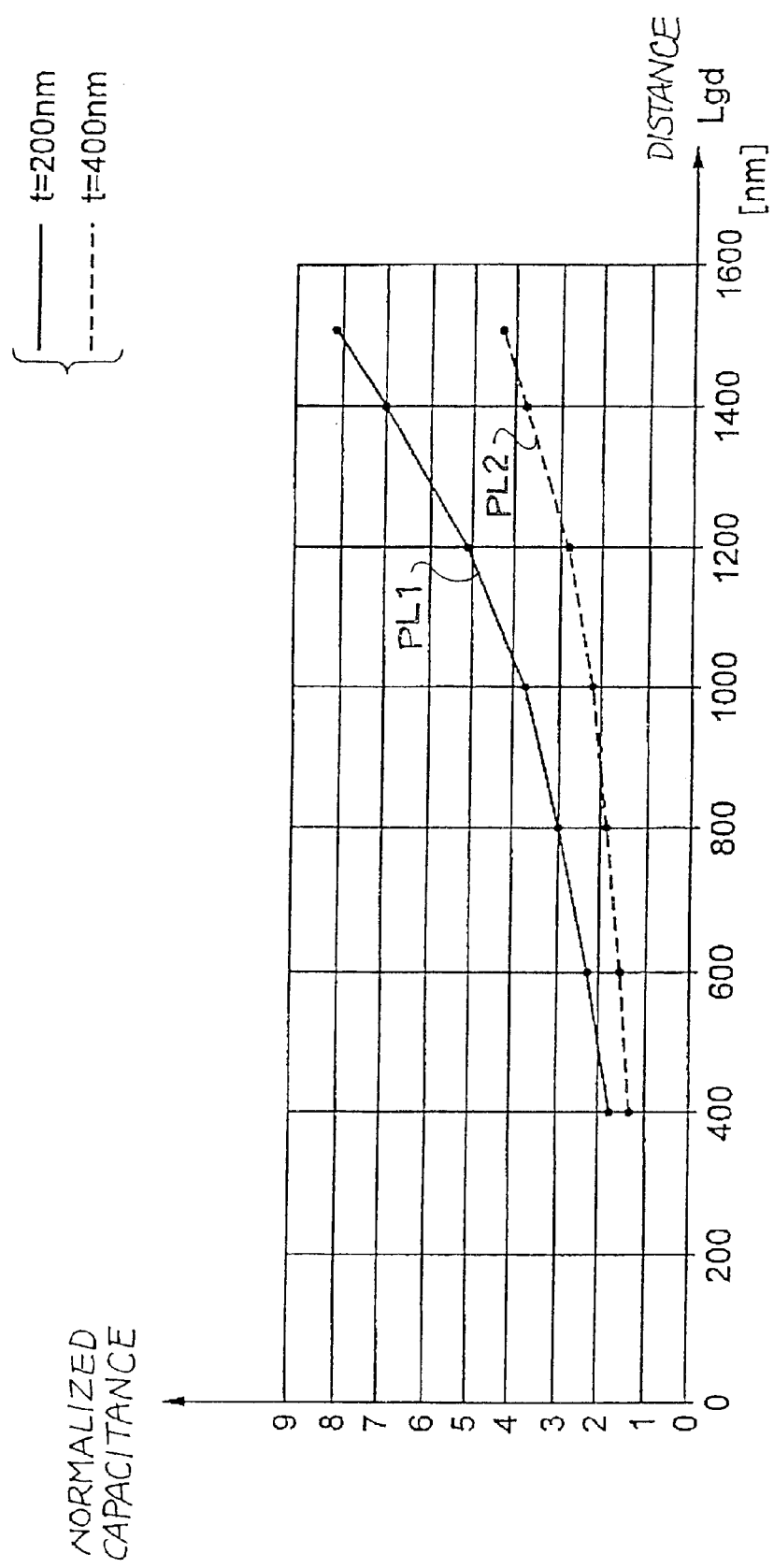
FIG. 4 is a graph showing a relation between a normalized capacitance and a gate/drain overlay distance.

Using the samples from the first group, the present inventors calculated the normalized capacitance, and plotted the values of the normalized capacitance as indicated by line PL1 in FIG. 4. Similarly, the present inventors calculated the normalized capacitance of the samples in the second group, and plotted the values of the normalized capacitance as indicated by broken line PL2 in FIG. 4. Comparing lines PL1 with line PL2, the ratio of the normalized capacitance at 200 nanometers to the normalized capacitance at 400 nanometers was seen to decrease inversely to the gate/drain overlay distance, Lgd. In the samples where the gate/drain overlay distance, Lgd, was 400 nanometers, the normalized capacitance at 200 nanometers was only 1.2 times larger than the normalized capacitance at 400 nanometers. When the gate/drain overlay distance was increased to 1200 nanometers, the normalized capacitance at 200 nanometers was 1.8 times larger than the normalized capacitance at 400 nanometers. In other words, the samples in the first group were more sensitive to the gate/drain overlay distance than the samples in the second group.

Subsequently, the present inventors prepared samples with different in gate/drain overlay distances Lgd. The distance, Lrgd, of the samples was 1100 nanometers. The first sample had the gate/drain overlay distance Lgd of 400 nanometers, and the second sample had the gate/drain overlay distance Lgd of 1300 nanometers.

Figure 5:
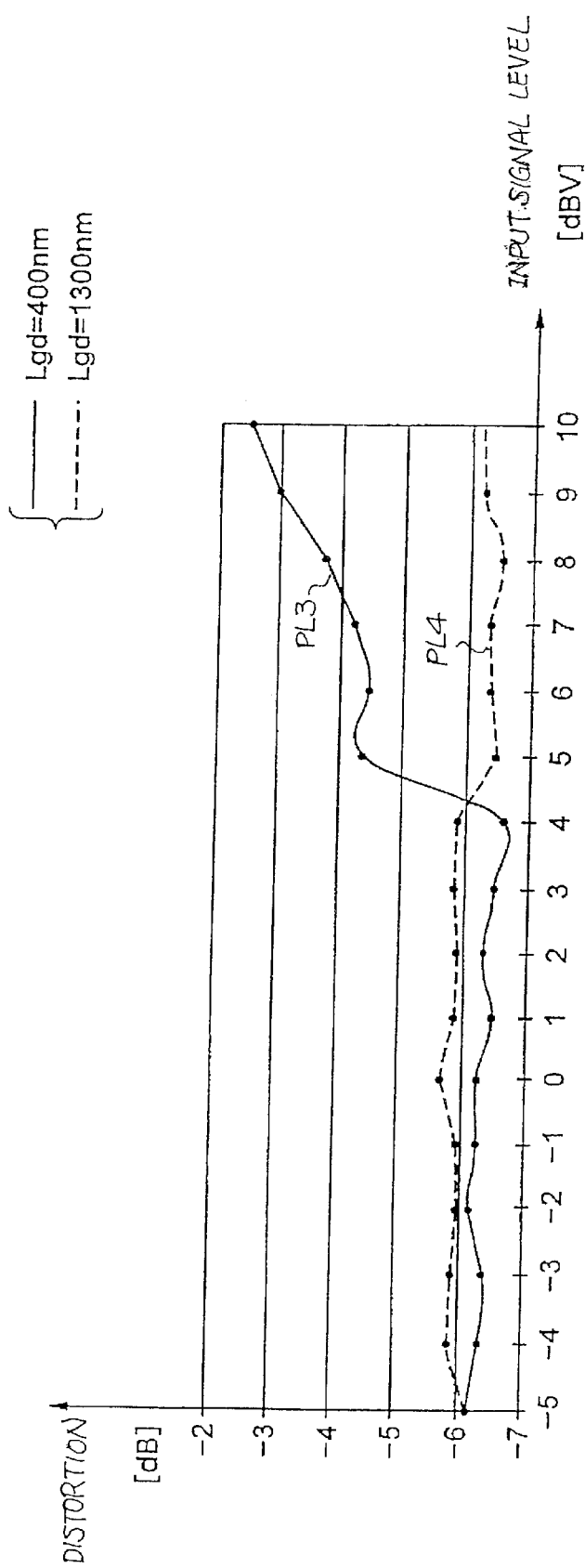
FIG. 5 is a graph showing a relation between a distortion and an input signal level.

The present inventors assembled the samples into a microwave communication wide band amplifier, and measured the distortion in terms of the input signal level. The input signal level was varied from −5 dBV to +1 dBV, and the distortion was plotted as shown in FIG. 5. Plots PL3 and plots PL4 stood for the sample at 400 nanometers and the sample at 1300 nanometers, respectively. Although the sample at 400 nanometers rapidly increased the distortion around the input signal level of +5 dBV, the distortion of the sample at 1300 nanometers was less dependent on the input signal level. In fact, when the input signal level was increased from −5 dBV to +10 dBV, the sample at 400 nanometers had the distortion increased by 3.5 dB. However, the distortion of the sample at 1300 nanometers was gently decreased toward the input signal level of +10 dBV. Thus, the long gate/drain overlay distance was effective against the distortion.

Subsequently, the present inventors fabricated samples of the Schottky barrier field effect transistor varying in both of thickness and gate/drain overlay distance, Lgd. The first sample had a dielectric layer 5 of 200 nanometers and the gate/drain overlay distance Lgd of 1300 nanometers. The second sample had the dielectric layer 5 of 400 nanometers and the gate/drain overlay distance Lgd of 1300 nanometers. The third sample had a dielectric layer 5 of 400 nanometers and the gate/drain overlay distance, Lgd, of 400 nanometers. Thus, the first sample was equal in the gate/drain overlay distance to the samples of the second sample, but was different in the thickness of the dielectric layer. On the other hand, the second sample was equal in thickness of the dielectric layer 5 to the third sample, but was different in the gate/drain overlay distance from the second sample.

Figure 6:
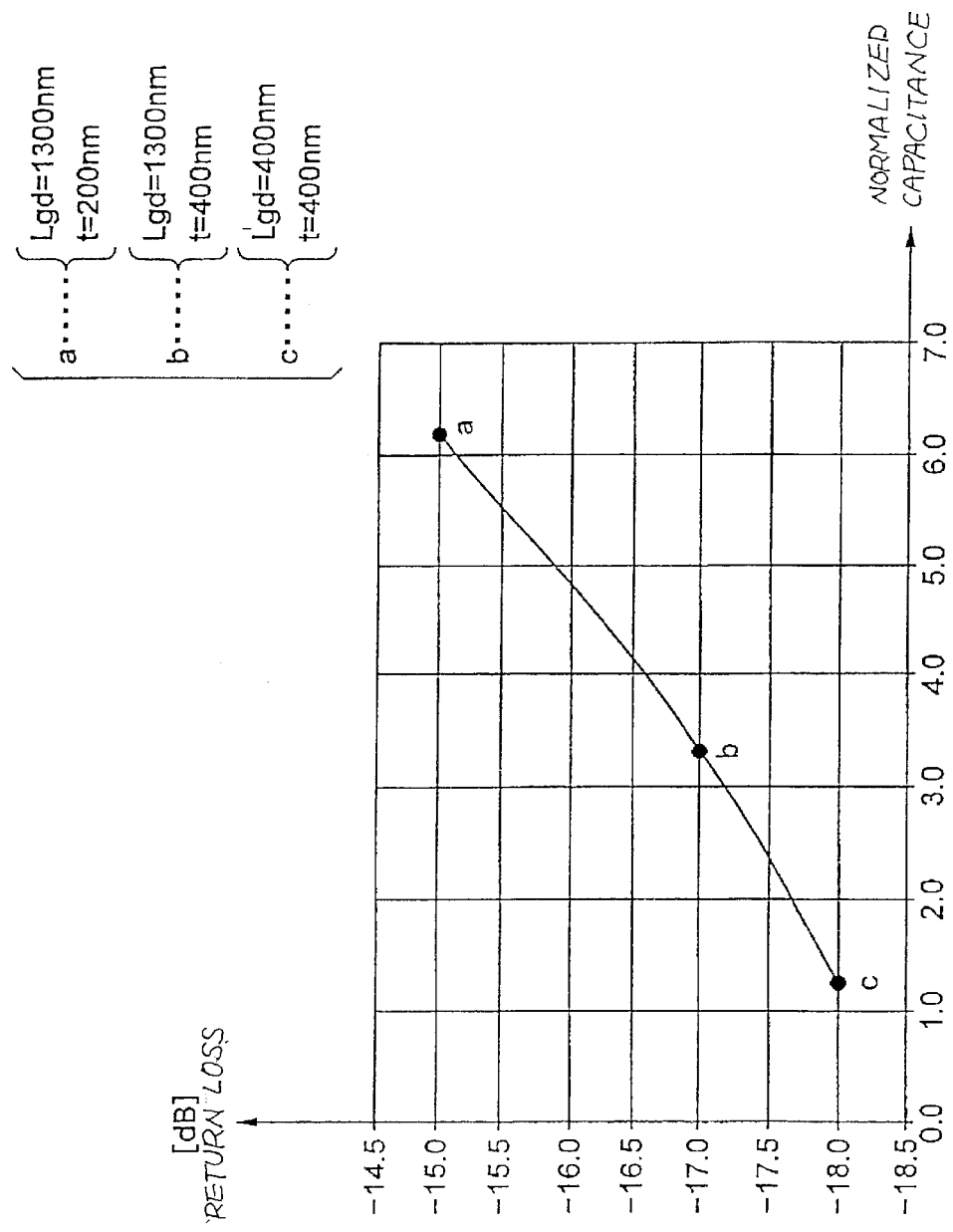
FIG. 6 is a graph showing a relation between a return-loss and the combination of the thickness of a dielectric layer and the gate/drain overlay distance.

The present inventors calculated the normalized capacitance of the samples, and measured their return-loss. The present inventors plotted the values of the return-loss in terms of the normalized capacitance as shown in FIG. 6. Comparing point a with point b, the increase in the thickness from 200 nanometers to 400 nanometers resulted in the return loss decreasing by 2 dB. On the other hand, when the gate/drain overlay distance was decreased from 1300 nanometers to 400 nanometers, the return-loss was decreased by 1 dB.

Thus, the present inventor discovered that both the thickness of the dielectric layer 5 and the gate/drain overlay distance, Lgd were influential on the withstanding voltage, distortion and return-loss. The present inventors fabricated samples of the Schottky barrier field effect transistor which were different in the combination of the thickness of the dielectric layer 5 and the gate/drain overlay distance similar to the samples used for the evaluation shown in FIG. 6. The samples had the distance Lrgd from 800 nanometers long to 3000 nanometers long. The distance, Lrgd, was determined on the basis of the dimensions of actual Schottky barrier field effect transistors to be required for the microwave wide band amplifier.

The present inventors evaluated the samples to determine the range of the thickness and the range of the gate/drain overlay distance Lgd. The present inventors measured the withstanding voltage, the distortion and the return-loss for each of the samples. Even though the thickness of the dielectric layer 5 was out of the range expressed by the conditional expression (2), i.e., 97.5 nm<t<273 nm for the case of silicon dioxide, the distortion and the return-loss were acceptable without sacrifice of the withstanding voltage in so far as the following conditions were satisfied. The first condition was that the dielectric layer 5 fell within the range from 300 nanometers to 600 nanometers, and the second condition was that the gate/drain overlay distance Lgd was Lrgd+/−400 nanometers.

Even if the gate/drain overlay distance, Lgd, was long, the thin dielectric, layer 5 decreases the electric field concentration. The electrostatic capacitance per unit area of the laminated structure of the field plate 11, the channel layer 1 and the dielectric layer 5 effects the electric field concentration on the drain side rather than on the remaining portion of the gate electrode 7, and makes the dispersion of the strength of the electric field close to the ideal dispersion. This results in the decrease of the electric field concentration. The electrostatic capacitance makes the electric lines of force extending from the ionized donor terminated there. The result is that even if the excess radio frequency signal is inputted, the electrostatic capacitance suppresses the accumulation of the electric charge at the boundary of the semiconductor layer on the drain side. Therefore, the distortion is made small.

As will be understood from the foregoing description, the structure in the recess designed in accordance with the present invention permits the Schottky barrier field effect transistor to achieve good transistor characteristics, i.e., high withstanding voltage, small distortion and small return-loss.

Second Embodiment

Turning to FIG. 7A, another Schottky barrier field effect transistor embodying the present invention is fabricated on a semi-insulating substrate 10. The Schottky barrier field effect transistor implementing the second embodiment comprises a channel layer 1, a drain contact layer 3, a source contact layer 4, a dielectric layer 5 and a gate electrode 7.

The channel layer 1 is laminated on the major surface of the semi-insulating substrate 10, and is formed of n-type gallium arsenide, the drain contact layer 3 and the source contact layer 4 are formed on the channel layer 1, and the drain contact layer 3 is separated from the source contact layer 4. The drain contact layer 3 and the source contact layer 4 are formed of n-type gallium arsenide. A part of the channel layer 1 is exposed to the gap or recess between the drain contact layer 3 and the source contact layer 4. The drain contact layer 3, the part of the channel layer 1 and the source contact layer 4 are covered with the dielectric layer 5. Though not shown in FIG. 7A, a drain electrode and a source electrode are held in contact with the drain contact layer 3 and the source contact layer 4 through contact holes formed in the dielectric layer 5.

A contact hole is formed in the dielectric layer 5, and reaches to the part of the channel layer 1 between the drain contact layer 3 and the source contact layer 4. The gate electrode 7 is formed on the dielectric layer 5, and is held in contact with the channel layer 1 through the contact hole. The gate electrode 7 is formed of metal, and a Schottky barrier is now formed between the channel layer 1 and the gate electrode 7. The gate electrode 7 has a field plate 11, and the field plate 11 projects from the remaining portion of the gate electrode 7 toward the drain contact layer 3. The remaining portion passes through the contact hole, and reaches the channel layer 1. The gate electrode 7 has a Schottky contact portion 7a on the dielectric layer 5.

The Schottky contact portion 7a is separated from the drain contact layer 3 by the distance, Lrgd. In this instance, the distance, Lrgd, falls within the range between 800 nanometers and 3000 nanometers, and the gate/drain overlay distance, Lgd, is Lrgd±400 nanometers.

The source contact layer 4 is held in contact with the channel layer 1, and the inner edge of the source contact layer 4 is labeled with "a" in FIG. 7B. Similarly, the gate electrode 7 is held in contact with the dielectric layer 5, and the left edge of the gate electrode 7 extends along line "b." The dielectric layer 5 is held in contact with the channel layer 1, and has a left inner surface along line "c" and a right inner surface along line "d". The field plate 11 is held in contact with the dielectric layer 5, and is formed into a comb-like configuration. For this reason, a zig-zag line "e" is on the end surface of the field plate 11. The drain contact layer 3 is held in contact with the channel layer 1, and has the inner end indicated by line "f."

The Schottky barrier field effect transistor is fabricated through a process similar to that of the first embodiment except that the photo-resist etching mask for the gate electrode has the edge surface extending along line "e."

The comb-like field plate 11 increases the contact area between the gate electrode 7 and the dielectric layer 5 and, accordingly, the area opposed to the channel layer 1 to decrease on the drain side. The gate electrode 7, the dielectric layer 5 and the channel layer 1 form a capacitor as similar to those of the first embodiment. The electrostatic capacitance C of the capacitor is expressed as $$C = \in S/d \quad (4)$$

where $\in$ is the dielectric constant of the dielectric layer 5, S is the area opposed to the channel layer 1 and d is the distance between the gate electrode 7 and the channel layer 1. Since the area S is narrowed due to the comb-like end surface of the field plate 11, the capacitance C is decreased on the drain side. Thus, the parasitic capacitance is reduced by virtue of the comb-like end surface.

The present inventors fabricated a sample of the Schottky barrier field effect transistor implementing the second embodiment, and evaluated the sample. The present inventors assembled the sample in a microwave wide band amplifier, and measured the return-loss. The present inventors further fabricated a comparative sample which did not have the comb-like end surface, i.e., it had a flat end surface, and assembled the comparative sample in the microwave wide band amplifier for measuring the return-loss. The present inventors confirmed that the return-loss of the sample was smaller the return-loss of the comparative sample by 0.5 dB.

The present inventors, then, evaluated the Schottky barrier field effect transistor implementing the second embodiment through the experiments similar to the test on the first embodiment. The samples of the Schottky barrier field effect transistor implementing the second embodiment achieved small distortion and small return-loss without sacrifice of the withstanding voltage in the range described in conjunction with the first embodiment.

In the above-described embodiments, the drain contact layer 3 and the drain electrode (not shown) as a whole constitute a drain structure, and the source contact layer 4 and the source electrode (not show) form in combination a source structure.

Although particular embodiments of the present invention have been shown and described, it will be apparent to those skilled in the art that various changes and modifications may be made without departing from the spirit and scope of the present invention.

In the process described, the compound semiconductors are grown by using the molecular beam epitaxial system. However, the compound semiconductors may be grown by using a metal organic molecular beam epitaxial system. A multiple-recess structure may be employed in another Schottky barrier field effect transistor according to the present invention.

The compound semiconductors may be different from the gallium arsenide.

The dielectric layer 5 may be formed of an insulating substance different from silicon dioxide. In this instance, if the dielectric layer is equivalent to the silicon dioxide layer of 300 nanometers to 600 nanometers, the above-described advantages are achieved.

What is claimed is:

1. A Schottky barrier field effect transistor fabricated on a substrate, comprising:

a channel layer formed of a first compound semiconductor;

a source structure connected to a first portion of said channel layer;

a drain structure connected to a second portion of said channel layer, and spaced from said source structure to form a recess;

a dielectric layer covering said channel layer, a part of said source structure and a part of said drain structure, and having a contact hole between said source structure and said drain structure; and a gate electrode contacting only said dielectric layer and said channel layer, and having a Schottky contact portion in contact with said channel layer through said contact hole for producing a Schottky contact with said channel layer and a field plate extending from said Schottky contact portion toward said drain structure on said dielectric layer, a thickness of said dielectric layer between said channel layer and said field plate being equivalent to a thickness of a silicon dioxide layer of 300 nanometers or more, wherein a distance between said Schottky contact portion and said drain structure ranges from 800 nanometers to 3000 nanometers, and said field plate has a length expressed as Lrgd±400 nanometers where Lrgd is a distance between said Schottky contact portion and said drain structure.

2. The Schottky barrier field effect transistor as set forth in claim 1, in which said drain structure includes a drain contact layer formed of a second compound semiconductor, and said distance, Lrgd, is measured from said Schottky contact portion and said drain contact layer.

3. The Schottky barrier field effect transistor as set forth in claim 2, in which said first compound semiconductor and said second compound semiconductor are n-type gallium arsenide different in dopant concentration.

4. The Schottky barrier field effect transistor as set forth in claim 1, in which said thickness of said dielectric layer is 600 nanometers or less.

5. The Schottky barrier field effect transistor as set forth in claim 4, in which said drain structure includes a drain contact layer formed of a second compound semiconductor, and said distance is measured from said Schottky contact portion and said drain contact layer.

6. The Schottky barrier field effect transistor as set forth in claim 1, in which said dielectric layer is formed of silicon dioxide, and said thickness of said dielectric layer ranges from 300 nanometers to 600 nanometers.

7. The Schottky barrier field effect transistor as set forth in claim 1, in which said distance is measured between said Schottky contact portion and a drain contact portion held in contact with said second portion of said channel layer and formed of a second compound semiconductor.

8. The Schottky barrier field effect transistor as set forth in claim 7, in which said first compound semiconductor and said second compound semiconductor are n-type gallium arsenide different in dopant concentration.

9. The Schottky barrier field effect transistor as set forth in claim 1, in which said field plate had a leading end portion with a comb-like configuration.

10. The Schottky barrier field effect transistor as set forth in claim 1, in which said drain structure includes a drain contact layer formed of a second compound semiconductor, and first compound semiconductor and said second compound semiconductor are n-type gallium arsenide different in dopant concentration.

11. A Schottky barrier field effect transistor fabricated on a substrate, comprising:

a channel layer formed of a first compound semiconductor;

a source structure connected to a first portion of said channel layer;

a drain structure connected to a second portion of said channel layer, and spaced from said source structure to form a recess;

a dielectric layer covering said channel layer, a part of said source structure and a part of said drain structure, and having a contact hole between said source structure and said drain structure; and a gate electrode contacting only said dielectric layer and said channel layer, and having a Schottky contact portion in contact with said channel layer through said contact hole for producing a Schottky contact with said channel layer and a field plate extending from said Schottky contact portion toward said drain structure on said dielectric layer, a thickness of said dielectric layer between said channel layer and said field plate being equivalent to the thickness of a silicon dioxide layer of 300 nanometers or more, and said field plate having a length expressed as Lrgd±400 nanometers where Lrgd is a distance between said Schottky contact portion and said drain structure.

12. The Schottky barrier field effect transistor as set forth in claim 11, in which said drain structure includes a drain contact layer formed of a second compound semiconductor, and said distance, Lrgd, is measured from said Schottky contact portion and said drain contact layer.

13. The Schottky barrier field effect transistor as set forth in claim 12, in which said first compound semiconductor and said second compound semiconductor are n-type gallium arsenide different in dopant concentration.

* * * * *